(12) United States Patent
Qi et al.

(10) Patent No.: US 8,489,405 B2
(45) Date of Patent: Jul. 16, 2013

(54) COMPRESSION CODING AND DECODING METHOD, CODER, DECODER, AND CODING DEVICE

(75) Inventors: Fengyan Qi, Beijing (CN); Lei Miao, Beijing (CN); Qing Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/309,373

(22) Filed: Dec. 1, 2011

(65) Prior Publication Data

US 2012/0078641 A1 Mar. 29, 2012

Related U.S. Application Data

(63) Continuation of application No. PCT/CN2010/073381, filed on May 31, 2010.

(30) Foreign Application Priority Data

Jun. 1, 2009 (CN) .......................... 2009 1 0107562
Jun. 25, 2009 (CN) .......................... 2009 1 0149824

(51) Int. Cl.
*G10L 19/00* (2006.01)
*G10L 19/04* (2006.01)
*G10L 19/12* (2006.01)

(52) U.S. Cl.
USPC ........... 704/500; 704/501; 704/503; 704/504; 704/222; 704/236

(58) Field of Classification Search
USPC ................... 704/500–504, 222, 236, E19.001
See application file for complete search history.

(56) References Cited

U.S. PATENT DOCUMENTS 6,475,245 B2 * 11/2002 Gersho et al. ................. 704/208
6,625,574 B1 9/2003 Taniguchi et al.
(Continued)

FOREIGN PATENT DOCUMENTS

| CN | 101304254 A | 11/2008 |
| CN | 101609680 A | 12/2009 |
| EP | 0957472 A2 | 11/1999 |
| EP | 1587061 A1 | 10/2005 |
| KR | 20080007060 A | 1/2008 |
| KR | 1020080007060 A | 1/2008 |
| WO | WO 2006126121 A2 | 11/2006 |

OTHER PUBLICATIONS

International Search Report in corresponding PCT Application No. PCT/CN2010/073381 (Sep. 2, 2010).

(Continued)

*Primary Examiner* — Pierre-Louis Desir
*Assistant Examiner* — Abdelali Serrou
(74) *Attorney, Agent, or Firm* — Leydig, Voit & Mayer, Ltd.

(57) ABSTRACT

The embodiments of the present invention relate to a compression coding and decoding method, a coder, a decoder and a coding device. The compression coding method includes: extracting sign information of an input signal to obtain an absolute value signal of the input signal; obtaining a residual signal of the absolute value signal by using a prediction coefficient, where the prediction coefficient is obtained by prediction and analysis that are performed according to a signal characteristic of the absolute value signal of the input signal; and multiplexing the residual signal, the sign information and a coding parameter to output a coding code stream, after the residual signal, the sign information and the coding parameter are respectively coded, so as to improve compression efficiency of a voice and audio signal.

22 Claims, 10 Drawing Sheets

U.S. PATENT DOCUMENTS

| | | | |
|---|---|---|---|
| 6,895,375 B2* | 5/2005 | Malah et al. | 704/219 |
| 7,583,849 B2* | 9/2009 | Cai et al. | 382/240 |
| 8,068,569 B2* | 11/2011 | Pang et al. | 375/346 |
| 2001/0041984 A1* | 11/2001 | Van Der Vleuten | 704/500 |
| 2005/0027516 A1 | 2/2005 | Lee et al. | |
| 2006/0020453 A1* | 1/2006 | Son et al. | 704/230 |
| 2007/0019876 A1 | 1/2007 | Cai et al. | |
| 2008/0082325 A1* | 4/2008 | Tsuji et al. | 704/225 |
| 2008/0284623 A1 | 11/2008 | Beack et al. | |
| 2009/0037185 A1 | 2/2009 | Liebchen | |
| 2009/0041021 A1* | 2/2009 | Meany et al. | 370/394 |
| 2009/0048850 A1* | 2/2009 | Liebchen | 704/500 |
| 2009/0102686 A1 | 4/2009 | Fukuhara et al. | |
| 2009/0109070 A1* | 4/2009 | Maeda | 341/67 |
| 2009/0254783 A1* | 10/2009 | Hirschfeld et al. | 714/701 |
| 2010/0027625 A1* | 2/2010 | Wik et al. | 375/240.12 |

OTHER PUBLICATIONS

Written Opinion of the International Searching Authority in corresponding PCT Application No. PCT/CN2010/073381 (Sep. 2, 2010).

Liebchen et al., "MPEG-4 Audio Lossless Coding," Audio Engineering Society Convention Paper 6047, May 8-11, 2004, Audio ES, Berlin, Germany.

Yu et al., "MPEG-4 Scalable to Lossless Audio Coding," Audio Engineering Society Convention Paper 6183, Oct. 28-31, 2004, Audio ES, San Francisco, California.

"G.711—General Aspects of Digital Transmission Systems; Terminal Equipments; Pulse Code Modulation (PCM) of Voice Frequencies," ITU-T Recommendation G.11, 1988, International Telecommunication Union, Geneva, Switzerland.

"Document AC-0710-Q10-07—G711 Lossless Compression Algorithm: Market Need, Use Cases and Design Requirements," ITU-T WP3/16, Oct. 8-12, 2007, International Telecommunication Union, Geneva, Switzerland.

"Document AC-0710-Q10-08—A G711 Lossless Compression Algorithm Proposal," ITU-T WP3/16, Oct. 8-12, 2007, International Telecommunication Union, Geneva, Switzerland.

Extended European Search Report in corresponding European Patent Application No. 10782961.6 (Jun. 26, 2012).

1st Office Action in corresponding Australian Patent Application No. 2010256191 (Dec. 17, 2012).

* cited by examiner

COMPRESSION CODING AND DECODING METHOD, CODER, DECODER, AND CODING DEVICE

This application is a continuation of International Application No. PCT/CN2010/073381, filed May 31, 2010, which claims priority to Chinese Patent Application No. 200910107562.5, filed Jun. 1, 2009, and Chinese Patent Application No. 200910149824.4, filed Jun. 25, 2009, all of which are hereby incorporated by reference in their entireties.

FIELD OF THE INVENTION

The embodiments of the present invention relate to the field of signal coding and decoding, and in particularly to a signal compression technology, and specifically to a compression coding method and a compression decoding method, a compression coder and a compression decoder, and a compression coding device.

BACKGROUND OF THE INVENTION

In order to save a bandwidth for transmitting and storing voice and audio signals, a corresponding voice and audio coding technology has been widely applied. Currently, lossy coding and lossless coding are mainly divided. A reconstructed signal and an original signal in the lossy coding cannot be completely consistent with each other, but redundant information of a signal may be reduced to the maximum extent according to a feature of a sound source and a perception feature of human-beings, a small amount of coding information is transmitted, and higher voice and audio quality is reconstructed. For the lossless coding, it must be ensured that the reconstructed signal is completely consistent with the original signal, so that quality of the last decoding may not be deteriorated at all. Generally speaking, a compression rate of the lossy coding is higher, but the voice reconstruction quality is not ensured. Because the lossless coding may reconstruct a signal without distortion, voice quality may be ensured, but the compression rate is lower. A common lossless compression coder includes a short-term linear prediction coder (LPC, linear prediction coding), a long term predictor (LTP, Long Term Prediction), and an entropy coder. LPC prediction is used to remove short-term dependence of a voice signal, and LTP is used to remove long-term dependence of the voice signal, so as to improve the compression efficiency.

However, an existing conventional prediction method cannot be applicable to all types of input signals, and for some signals, by using these common prediction means, no compression gain can be obtained. For example, an input signal that has a larger dynamic range and changes rapidly in a time domain, and has a white noise-like spectrum in a frequency spectrum is difficult to be predicted and compressed, which severely affects compression efficiency of a voice and audio signal.

SUMMARY OF THE INVENTION

Embodiments of the present invention provide a compression coding method, a compression coding device, a compression decoding method, and a compression decoding device, in order to improve the compression efficiency of voice and audio signals.

An embodiment of the present invention provides a coding method, which includes: extracting sign information of an input signal to obtain an absolute value signal of the input signal; obtaining a residual signal of the absolute value signal by using a prediction coefficient, where the prediction coefficient is obtained by prediction and analysis that are performed according to a signal characteristic of the absolute value signal of the input signal; and multiplexing the residual signal, the sign information and a coding parameter to output a coding code stream, after the residual signal, the sign information and the coding parameter are respectively coded.

An embodiment of the present invention provides a compression coder, which includes: a sign extraction unit, configured to extract sign information of an input signal; a prediction unit, configured to obtain a prediction coefficient by prediction and analysis that are performed according to a signal characteristic of an absolute value signal that is obtained after the sign information of the input signal is extracted; a residual calculation unit, configured to obtain, according to the prediction coefficient, a residual signal of the absolute value signal for entropy coding; and a coding unit, configured to respectively code the residual signal, the sign information and a coding parameter.

An embodiment of the present invention further provides a compression coding device, which includes the preceding compression coder, and further includes a signal receiver, configured to receive an input signal; and a code stream multiplexer, configured to multiplex sign information of the input signal, and a residual signal, and a coding parameter of the compression coder to form a coding code stream, after the sign information of the input signal, and the residual signal, and the coding parameter of the compression coder are respectively coded.

Therefore, by introducing the embodiments of the present invention, sign information of an input signal is extracted to obtain an absolute value signal of the input signal; a prediction coefficient is obtained by prediction and analysis that are performed according to a signal characteristic of the absolute value signal of the input signal; a residual signal of the absolute value signal is obtained by using the prediction coefficient; and the entropy-coded residual signal, the quantized sign information, and a parameter required for coding are multiplexed to output a coding code stream. Therefore, input signals with different characteristics can be effectively compressed, an obvious compression gain is obtained, and compression efficiency of a voice and audio signal is improved.

BRIEF DESCRIPTION OF THE DRAWINGS

To describe the technical solutions in the embodiments of the present invention or in the prior art more clearly, the accompanying drawings required for describing the embodiments or the prior art are introduced briefly in the following. Apparently, the accompanying drawings in the following description are only some embodiments of the present invention, and persons of ordinary skill in the art may also derive other drawings from the accompanying drawings without creative efforts.

DETAILED DESCRIPTION OF THE EMBODIMENTS

The technical solutions in the embodiments of the present invention are clearly and fully described in the following with reference to the accompanying drawings in the embodiments of the present invention. It is obvious that the embodiments to be described are only a part rather than all of the embodiments of the present invention. Based on the embodiments of the present invention, all other embodiments obtained by persons of ordinary skill in the art without creative efforts shall fall within the protection scope of the present invention.

Generally, a conventional prediction method is not applicable to all types of input signals, and for some signals, a better compression gain may not be obtained by adopting direct prediction. In the embodiments of the present invention, sign removal processing is performed on an input signal, which is especially effective for a signal that does not have an obvious prediction gain, and prediction and filtering are performed on the signal after sign removal according to a signal characteristic of the signal after sign removal, so as to improve final compression efficiency.

Compression Coding Method Embodiment 1

Figure 1:
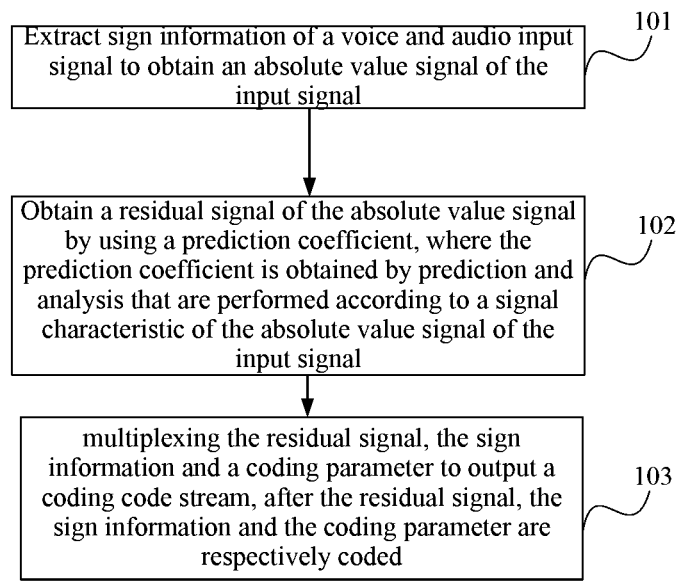
FIG. 1 is a schematic diagram of a compression coding method according to a first embodiment.

FIG. 1 is a schematic diagram of a compression coding method according to a first embodiment. The method includes:

Step 101: Extract sign information of an input signal to obtain an absolute value signal of the input signal.

A voice and audio input signal to be coded includes two parts of information, one is the sign information in the signal, and the other is the absolute value signal after the sign information is removed from the input signal. The extracted sign information of the input signal is quantized to obtain quantized sign information.

Step 102: Obtain a residual signal of the absolute value signal by using a prediction coefficient, where the prediction coefficient is obtained by prediction and analysis that are performed according to a signal characteristic of the absolute value signal of the input signal.

A quantized prediction coefficient is used to perform prediction to obtain the residual signal, and entropy coding is performed on the residual signal. The prediction coefficient adopted in this step may be preset, that is, a prediction mode is determined according to the signal characteristic of the absolute value signal that is obtained after the sign information is removed from the input signal, and prediction and analysis are performed on the prediction mode to obtain the prediction coefficient, or may be obtained after step 101 and before step 102.

Step 103: Multiplex the residual signal, the quantized sign information, and a parameter required for coding to output a coding code stream, after the residual signal, the quantized sign information, and the parameter required for coding are respectively coded.

In this step, the coding code stream generated by multiplexing includes the residual signal obtained by entropy coding and the sign information obtained by quantization, and further includes a coding parameter required by a coding end after coding. The coding parameter is used by a decoding end for decoding. The coding parameter includes, but is not limited to, a mapping coefficient, a quantization parameter, a prediction coefficient, or side information. The side information includes a prefix code of a coding mode identifier.

By introducing this embodiment, input signals with different characteristics can be effectively compressed, an obvious compression gain is obtained, and compression efficiency of a voice and audio signal is improved.

Compression Coding Method Embodiment 2

Figure 2:
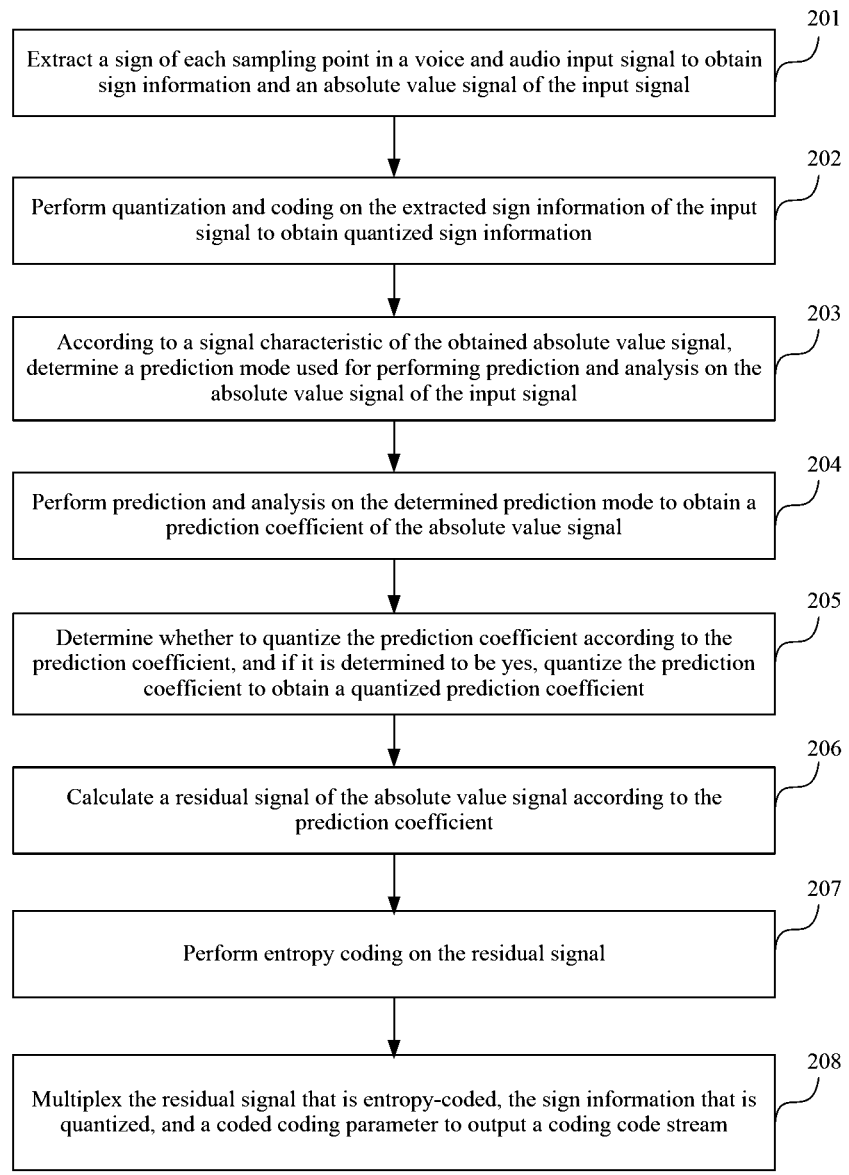
FIG. 2 is a schematic diagram of a compression coding method according to a second embodiment.

FIG. 2 is a schematic diagram of a compression coding method according to a second embodiment. The method includes:

Step 201: Extract a sign of each sampling point in an input signal to obtain sign information and an absolute value signal of the input signal.

A voice and audio input signal includes sign information representing positive and negative properties and an absolute value signal representing signal amplitude. Generally, the sign information is expressed by using a binary system, that is, 0 and 1, and definitely, may also be flexibly set according to a coding end device within an available range. When a sampling point of the input signal is a negative value, sign information of the sampling point is 0, and on the contrary, the sign information of the sampling point is 1. The sign information of the input signal is expressed as a binary sequence, and for a sampling point, sign information of the sampling point may be expressed as sign(n), where n is a natural number smaller than N, and N is the number of sampling points of the input signal. An absolute value signal z of the input signal is obtained at the same time with the sign information, and the input signal whose sign information is removed is the absolute value signal. The input signal represented as y is taken as an example, when a sampling point $y(n)$ is a negative value, an absolute value signal of the sampling point is $z(n)=-y(n)$; while when the sampling point $y(n)$ is a positive value, the absolute value signal of the sampling point is $z(n)=y(n)$, so that the absolute value signal may be uniformly expressed as $z(n)=|y(n)|$.

Step 202: Perform quantization and coding on the extracted sign information of the input signal to obtain quantized sign information.

When the sign information of the input signal is expressed by using the binary system, binary coding may be adopted to quantize the sign information to obtain a quantized sign, and the binary coding includes 0/1 binary coding, run-length binary coding, or other types of binary coding. Taking the 0/1 binary coding for example, the 0/1 binary coding directly writes 0/1 sign information representing positive and negative properties into a coding bit stream. If a change frequency of a sign value of the $y(n)$ is lower, that is, a situation where a positive value or a negative value consecutively appears occurs frequently, a run-length binary coding method may be used. The run-length binary coding method is described as follows.

First, run-length coding information is analyzed, for example, frame length is N=40, an appearing sequence of values of a sampling point is: consecutive 10 positive values, consecutive 8 negative values, consecutive 18 positive values, and consecutive 4 negative values, and run-length information may be expressed as ((0, 10), (1, 8), (0, 18), (1, 4)). Then, the run-length information is coded. Since only two values exist, optimization may be performed to some extent when the information is coded. For example, merely sign information of a first group is coded, and the number of consecutive appearing times of the sampling point of the same sign in other groups is coded, so that the run-length information to be coded in this example is ((0, 10), (8), (18), (4)).

Step 203: According to a signal characteristic of the obtained absolute value signal, determine a prediction mode used for performing prediction and analysis on the absolute value signal of the input signal.

The signal characteristic of the absolute value signal includes a frequency spectrum energy characteristic, a frequency spectrum distribution characteristic, and a frequency spectrum type that embody a feature of the voice and audio signal. The prediction mode may also be selected according to an environmental parameter in addition to the signal characteristic, for example, may be determined by estimating prediction complexity and a bit number required for transmitting a prediction coefficient. In this embodiment, taking as an example that the prediction mode is selected from a short-term LPC prediction mode and a fixed coefficient prediction mode, by analyzing a frequency spectrum, if the frequency spectrum of the absolute value signal changes greatly and does not concentrate in a certain frequency band, and the prediction complexity is higher, under this circumstance, the short-term LPC prediction may be selected preferentially. If the energy of the absolute value signal mainly concentrates in a certain frequency band or in several frequency bands according to the characteristic of the absolute value; other frequency bands form a noise-like spectrum; the prediction complexity required by the solution is relatively lower; and a bit number required for transmitting the prediction coefficient is smaller; the fixed coefficient prediction may be used preferentially. Furthermore, if most of the energy of the absolute value signal concentrates in a low frequency, a predictor having a similar high-pass filtering effect needs to be selected. Definitely, a selection standard of the prediction mode is not limited to the preceding modes, and may also include other standards well-known to persons skilled in the art. Moreover, each standard may be adopted in combination or adopted selectively.

Step 204: Perform prediction and analysis on the determined prediction mode to obtain a prediction coefficient of the absolute value signal.

According to the description in step 203, if it is determined to use the short-term LPC prediction, a Levinson-Durbin algorithm may be applied to the absolute value signal to obtain a corresponding p-order short-term LPC prediction coefficient a(i), where i=1, ..., p, and a value of p generally ranges from 1 to 16, and a corresponding predictor is:

$$1 - \sum_{i=1}^{p} a(i)z^{-i}.$$

If it is determined to use the fixed coefficient prediction, taking the absolute value signal obtained after the sign removal into consideration, the dependence of the sampling point is enhanced, and the energy of the signal mainly concentrates in a low frequency, a predictor having a high-pass filtering effect may be designed. Furthermore, considering compression efficiency and complexity, and lossless implementation of a fixed point, for example, a predictor in the following series may be designed:

$$-1 + z^{-1};$$
$$-1 + 0.5(z^{-1} + z^{-2});$$
$$-1 + 0.25(z^{-1} + z^{-2} + z^{-3} + z^{-4});$$
$$\ldots$$
$$-1 + \sum_{i=1}^{2^m} \frac{1}{2^m} z^{-i}, \text{ where } m = 0, 1, \ldots, L, \text{ and } L < (N-1).$$

The preceding predictor may also be expressed by using a prediction value form as follows:

$$z'(n) = z(n-1);$$
$$z'(n) = 0.5*(z(n-1) + z(n-2));$$
$$z'(n) = 0.25*(z(n-1) + z(n-2) + z(n-3) + z(n-4));$$
$$\ldots$$
$$z'(n) = \sum_{i=1}^{2^m} \frac{1}{2^m} z(n-i),$$

where z'(n) represents a prediction value of the signal, and in order to facilitate the lossless implementation of the fixed point, the prediction coefficient is designed as $\frac{1}{2}^m$, where m may be equal to 2. The following expression is obtained:

$$z'(n)=0.25*(z(n-1)+z(n-2)+z(n-3)+z(n-4)),$$

where z'(n) is the prediction value of the signal, and the prediction coefficient is 0.25, and the prediction coefficient facilitates the lossless implementation of the fixed point. The design of the filter may also be varied according to lossless or lossy voice and audio coding and decoding application, so as to ensure that the prediction coefficient by prediction and analysis that are performed according to the determined prediction mode is obtained.

When a fixed coefficient is adopted, two different kinds of implementation may exist, that is, only one set of fixed coefficients is used, and at least two sets of fixed coefficients are used for switching. If only one set of fixed coefficients is used, no information needs to be quantized and transmitted, and the same set of prediction coefficients is used for coding and decoding. If more than one set of fixed coefficients are used for switching, several different candidate sets of fixed coefficients need to be selected, and a selection standard is to see which set of fixed coefficients makes a final coding bit number smallest. For example, candidate fixed prediction coefficients are the first two sets of fixed prediction coefficients of the preceding predictor. First, the two sets of fixed prediction coefficients are respectivley used to predict the z(n) to obtain a residual signal and obtain a bit number required for quantizing the residual signal, and a set of coefficients with the smaller reuqired bit number is selected. A principle that makes a sum of the energy of the residual signal or a sum of the absolute values of the residual signal smaller may be used to determine which set of prediction coefficients is adopted.

Step 205: Determine whether to quantize the prediction coefficient according to the prediction coefficient, and if it is determined to be yes, quantize the prediction coefficient to obtain a quantized prediction coefficient.

When the short-term LPC prediction and analysis is performed, an obtained prediction coefficient a(i) is quantized to obtain a quantized prediction coefficient â(i). When the fixed coefficient prediction and analysis is performed to obtain the fixed prediction coefficient, switching is performed between two kinds of prediction implementation manners by using the fixed prediction coefficients, that is, by using only one set of fixed prediction coefficients and by using at least two sets of fixed prediction coefficients. If only one set of fixed prediction coefficients is used, no information needs to be quantized and output, and the same set of fixed prediction coefficients is adopted by a coding end and a decoding end. If more than one set of fixed prediction coefficients are used for switching, the several different candidate sets of fixed coefficients need to be selected, and then a serial number of the selected fixed prediction coefficient is coded and quantized.

Step 206: Calculate a residual signal of the absolute value signal according to the prediction coefficient.

For the short-term LPC prediction, a residual signal e(n) of each sampling point is obtained through the quantized prediction coefficient â(i), the absolute value signal of the sampling point, and absolute value signals of the first p sampling points. In specific implementation, the following manner may be adopted:

$$e(n) = z(n) - \sum_{i=1}^{p} \hat{a}(i)z(n-i).$$

For the fixed prediction, the residual signal e(n) may be obtained according to the prediction coefficient determined through the switching of the prediction coefficients as described in step 204, and by using the prediction coefficient and the predictor that are determined in step 204, the residual signal e(n) of each sampling point is obtained through the fixed prediction coefficient, the absolute value signal of the sampling point, and absolute value signals of the first $2^m$ sampling points, that is, e(n)=z'(n)−z(n). For example, in specific implementation, the following manner may be adopted:

$$e(n) = -z(n) + \sum_{i=1}^{2^m} \frac{1}{2^m} z(n-i), \text{ where } m = 0, 1, \ldots, L, \text{ and } L < (N-1).$$

If m=2, in specific implementation, the following manner may be adopted:

$$\begin{cases} e(n) = z(n) & n < 4 \\ e(n) = 0.25 * (z(n-1) + z(n-2) + z(n-3) + z(n-4)) - z(n) & 4 \le n < N. \end{cases}$$

The prediction coefficient used in this step may be obtained through step 203 and step 204, and may also be preset. A preset method is the same as that in step 203 and step 204, and the difference lies in that, a preset prediction coefficient is directly used for calculating the residual signal in step 206, that is, the prediction coefficient may be obtained after step 202 or before step 201.

Step 207: Perform entropy coding on the residual signal.

The entropy coding may be performed by adopting entropy coding modes, such as rice coding, huffman coding, and arithmetic coding.

Step 208: Multiplex the residual signal that is entropy-coded, the sign information that is quantized, and a coded coding parameter to output a coding code stream.

Multiplexed data includes the entropy-coded residual signal and the quantized sign information, and further includes the coded coding parameter used for instructing the decoding end to perform decoding correctly. The coding parameter varies according to different technical means adopted by the coding end, and generally the coding parameter includes a mapping coefficient, a prediction coefficient, a quantization parameter, or side information. The side information includes a prefix code of a coding mode identifier. The information is transmitted through an identifier, a sign or data in a bit stream. Taking the fixed prediction coefficient as an example, a code of the fixed prediction coefficient that is coded and quantized in step 205 serves as a coding parameter, and is coded and multiplexed by using 1 bit and then output to the decoding end.

This embodiment may be applied to lossless coding of a voice and audio signal, and may also be applied to lossy coding or other data compression technologies.

By introducing this embodiment, input signals with different characteristics can be effectively compressed, an obvious compression gain is obtained, and compression efficiency of a voice and audio signal is improved.

Compression Coding Method Embodiment 3

Step 201 to step 208 can be performed on the input signal in Embodiment 2 because the input signal is a zero-mean signal. Being different from Embodiment 2, in this embodiment, an input signal needs to be recognized to judge whether the input signal is a zero-mean signal before each step in Embodiment 2 are performed.

Figure 3:
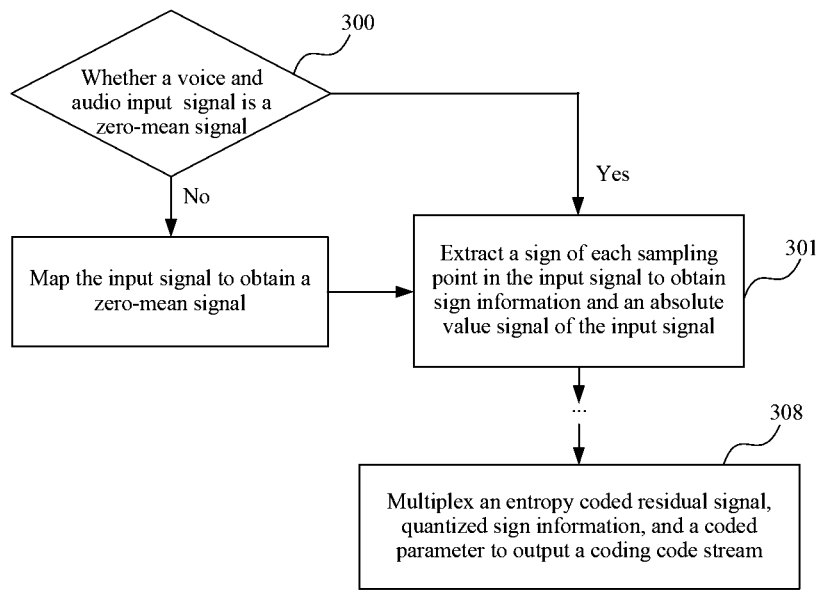
FIG. 3 is a schematic diagram of a compression coding method according to a third embodiment.

FIG. 3 is a schematic diagram of a compression coding method according to a third embodiment. The method includes:

Step 300: Judge whether an input signal is a zero-mean signal, and if the input signal is a zero-mean signal, step 301 is performed subsequently; otherwise, the input signal is mapped to obtain a zero-mean signal.

The mapping the input signal to obtain the zero-mean signal includes: selecting a mean value of the input signal as a mapping coefficient according to sampling point distribution of the input signal, and performing a mapping operation on the input signal and the mapping coefficient to obtain a zero-mean signal. Specifically, according to distribution of an input signal x(n), a mapping coefficient K is selected, so that the input signal is symmetrically distributed on two sides of a K value. The mapping coefficient K may be selected as a mean value of the input signal x(n), which is represented as:

$$K = \frac{1}{N} \sum_{n=0}^{N-1} x(n),$$

where K∈[min(x(n)), max(x(n))]]. The K value is added or subtracted to obtain a mapping signal y(n). The y(n) is a zero-mean signal, and if K is a negative value, y(n)=x(n)+K; and if K is a positive value, y(n)=x(n)−K.

Figure 4:
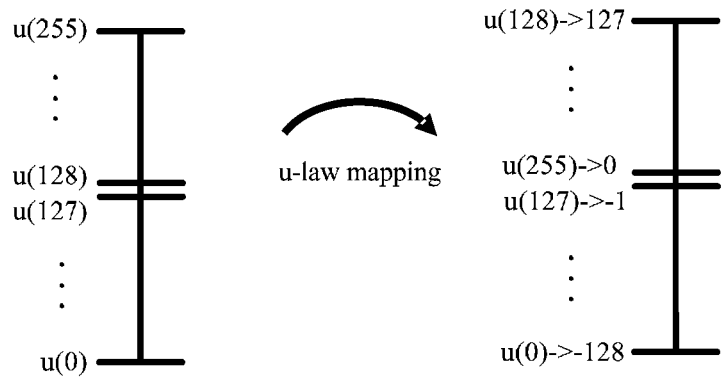
FIG. 4 is a schematic diagram of mapping of an input signal according to an compression coding method embodiment.

Other special mapping methods may also be adopted to obtain the zero-mean signal. For example, the input signal is an A-law or u-law signal of a g711 code stream. Since a value of a code stream signal is not consistent with a value of an actual voice signal represented by the code stream signal, mapping conversion needs to be performed. Taking u-law mapping of an input signal of [0, 255] for example, through an operation in this embodiment, the input signal is mapped to [−128, 127] to form a zero-mean signal, as shown in FIG. 4. In this mapping process, the mapping coefficient may not be transmitted, and a decoding end only needs to perform inverse mapping according to a mapping rule of a coding end.

Steps 301 to 308 are the same as steps 201 to 208 in Embodiment 2.

By introducing this embodiment, the preceding steps are performed by using the zero-mean signal. Based on that operation complexity is less affected, an input signal after mapping and judgment, and an input signal after mapping and sign removal can be effectively compressed, an obvious compression gain is obtained, and compression efficiency of a voice and audio signal is improved.

Compression Coding Method Embodiment 4

In combination with the coding method embodiment 2, step 400 in this embodiment is further included before step 201 in the coding method embodiment 2; or, in combination with the coding method embodiment 3, step 400 in this embodiment is further included before step 300 in the coding method embodiment 3, so as to judge whether a frame characteristic of an input signal satisfies a preset condition.

Figure 5:
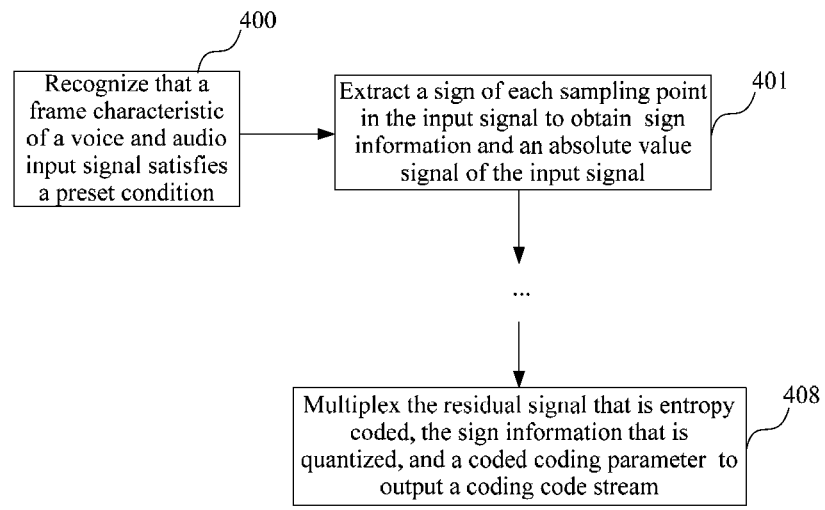
FIG. 5 is a schematic diagram of a compression coding method according to a fourth embodiment.

FIG. 5 is a schematic diagram of a compression coding method according to a fourth embodiment. The method includes:

Step 400: Recognize that a frame characteristic of the input signal satisfies a preset condition.

The input signal has different frame signal characteristics, and different signal characteristics are applicable to different compression coding solutions. A preset condition is set to judge whether the frame characteristic of the input signal satisfies the preset condition, so as to determine a subsequent operation. The preset condition may be the size of a dynamic range of the input signal and/or a change speed of the input signal. For example, if the dynamic range of the signal is larger, and the signal changes faster, and most of sampling points are distributed at two ends of extremely positive/negative values, it is recognized that the frame characteristic of the input signal satisfies the preset condition, and step 401 is performed subsequently. For example, a threshold may be respectively set on the two ends of the extremely positive/negative values of the input signal, for example, K1=37 and K2=165. If a value of a sampling point x(n)∈[0, K1] is input, it indicates that the sampling point is at the extremely negative end; if a value of a sampling point x(n)∈[128, K2] is input, it indicates that the sampling point is at the extremely positive end; and if the number of the sampling points at the two ends exceeds 70% of the total number of the sampling points in the whole frame, it is recognized that the frame characteristic of the input signal satisfies the preset condition, and a subsequent step is performed.

Steps 401 to 408 in this embodiment are the same as steps 201 to 208 in the coding method embodiment 2, and step 300 in the compression coding method embodiment 3 may also be performed between step 400 and step 401, to map the input signal that is not a zero-mean signal to obtain a zero-mean signal.

By introducing this embodiment, recognition is performed before a mapping step or before a mapping and sign removal step, so that more input signals applicable to the present invention can be effectively compressed, an obvious compression gain is obtained, and compression efficiency of a voice and audio signal is improved.

Compression Coding Method Embodiment 5

In combination with the coding method embodiment 2, step 500 in this embodiment is further included before step 201 in the coding method embodiment 2; or, in combination with the coding method embodiment 3, step 500 in this embodiment is further included before step 300 in the coding method embodiment 3, so as to recognize that a compression gain obtained by coding the input signal using at least one of other ordinary coding modes is smaller than or equal to a preset threshold.

Figure 6:
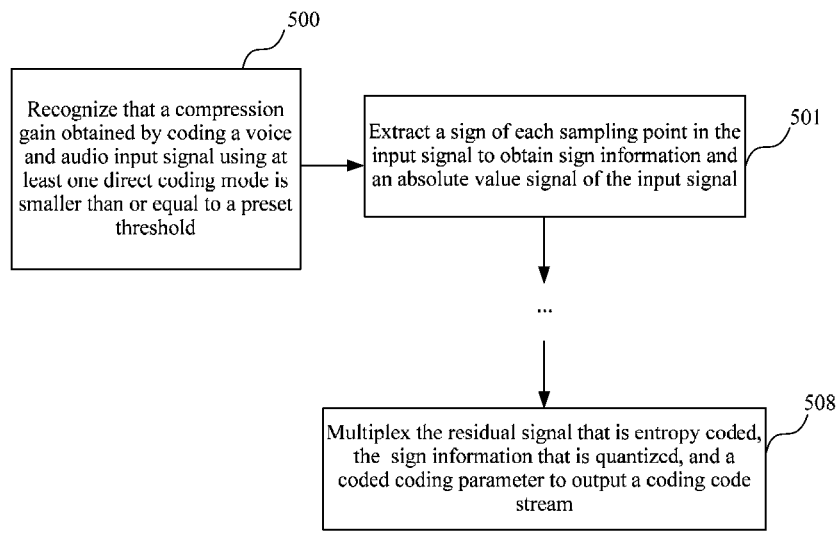
FIG. 6 is a schematic diagram of a compression coding method according to a fifth embodiment.

FIG. 6 is a schematic diagram of a compression coding method according to a fifth embodiment. The method includes:

Step 500: Recognize that a compression gain obtained by coding the input signal using at least one of other ordinary coding modes is smaller than or equal to a preset threshold.

Judge whether a compression gain is obtained when another ordinary coding mode is used for the input signal, and if no compression gain is generated, step 501 is performed. Whether the compression gain is obtained is determined based on that whether the number of bytes required for coding is smaller than the size of original data. Taking frame length N=40 for example, if the number of bytes required by another ordinary coding mode is smaller than 40, it indicates that the compression gain is obtained, and another ordinary coding mode may be an optimal mode among multiple coding modes or any of the coding modes. The optimal coding mode is set according to different application scenarios, for example, the optimal coding mode is a coding mode adopted when the number of bits/bytes required for coding is the smallest. A key factor of compression coding is a compression gain, and a gain in different coding modes is recognized to select a coding mode, so that coding efficiency may be effectively improved.

Steps 501 to 508 in this embodiment are the same as steps 201 to 208 in the coding method embodiment 2. Furthermore, this embodiment further includes step 509: further judging whether the number of bits required for coding information, such as a residual signal and a sign generated in steps 501 to 508, is smaller than the size of originally input data, and if yes, outputting a coding bit stream and mode information of the coding information, such as the residual signal and the sign; and if no, directly outputting the originally input data by using direct coding.

Figure 7:
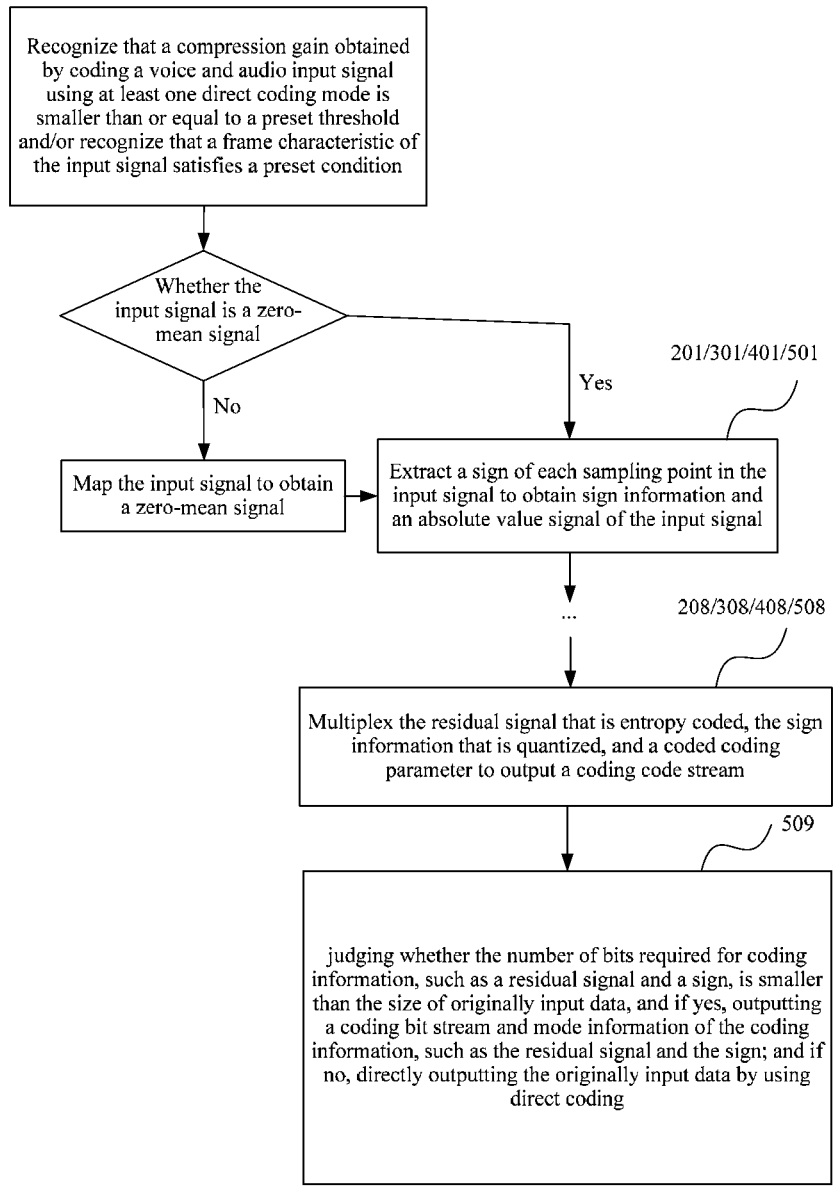
FIG. 7 is a schematic diagram of a compression coding method according to an embodiment.

Step 300 in the compression coding method embodiment 3 may also be performed between step 500 and step 501, to map an input signal that is not a zero-mean signal to obtain a zero-mean signal. This embodiment may also be in parallel with the coding method embodiment 4, and a subsequent step is performed when step 400 and step 500 are both satisfied, or a preferential judgment condition is set. For example, the judgment in step 400 is performed first, and when step 400 is satisfied, a subsequent operation is performed, and the judgment in step 500 is not performed. As shown in FIG. 7, this embodiment further includes step 509.

By introducing this embodiment, recognition is performed before a mapping step or before a mapping and sign removal step, so that more input signals applicable to the present invention can be effectively compressed, an obvious compression gain is obtained, and compression efficiency of a voice and audio signal is improved.

Through the compression coding method embodiments 1 to 5, a coding code stream is output from a coding end, and the coding code stream enters a decoding end; and the decoding end decodes a signal according to the received coding code stream to obtain an output signal, and the output signal is an original signal. A compression decoding method performed by the decoding end is a reverse process of the compression coding method, and the decoding end needs to restore the original signal actually through data decompression in the code stream.

Compression Decoding Method Embodiment 1

Figure 8:
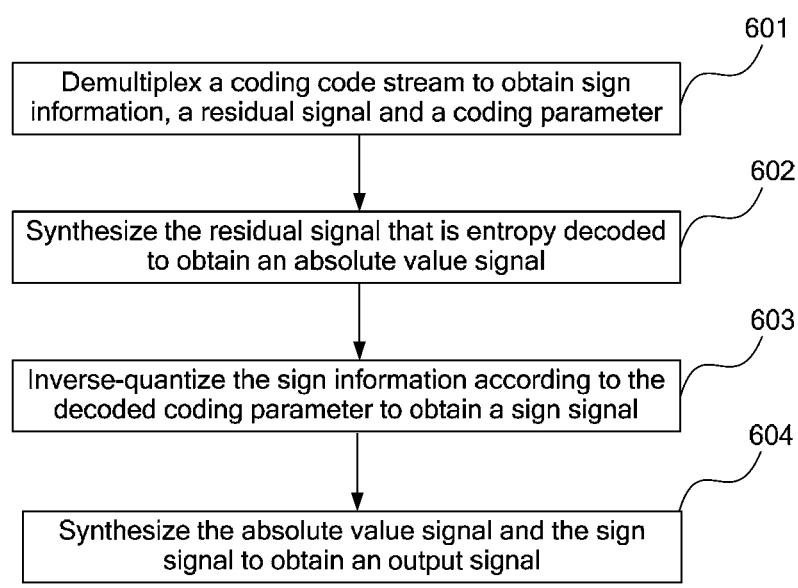
FIG. 8 is a schematic diagram of a compression decoding method according to a first embodiment.

FIG. 8 is a schematic diagram of a compression decoding method according to a first embodiment. The method includes:

Step 601: Demultiplex a coding code stream to obtain sign information, a residual signal and a coding parameter.

The coding parameter may include a mapping coefficient, a prediction coefficient, a quantization parameter, or side information. The coding parameter differs according to different compression coding implementation solutions. The coding parameter is used to support accurate decompression of parsed coding code stream in the compression decoding method.

Step 602: Synthesize the residual signal that is entropy decoded to obtain an absolute value signal.

Step 603: Inverse-quantize the sign information according to the decoded coding parameter to obtain a sign signal.

Step 604: Synthesize the absolute value signal and the sign signal to obtain an output signal.

By introducing this embodiment, input signals with different characteristics can be effectively compressed, an obvious compression gain is obtained, and compression efficiency of a voice and audio signal is improved.

Compression Decoding Method Embodiment 2

Figure 9:
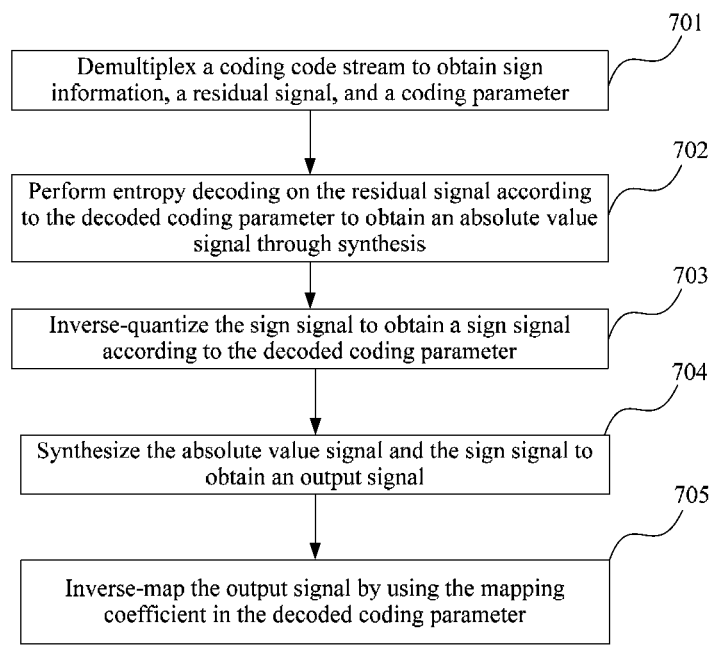
FIG. 9 is a schematic diagram of a compression decoding method according to a second embodiment.

FIG. 9 is a schematic diagram of a compression decoding method according to a second embodiment. The method includes:

Step 701: Demultiplex a coding code stream to obtain sign information, a residual signal, and a coding parameter.

According to the preceding different compression coding embodiments, the demultiplexed coding parameter is decoded to obtain a decoded coding parameter. The coding parameter may include any one or more kinds of the following: a quantization parameter and a prediction coefficient, or a fixed prediction quantization parameter, a mapping coefficient, and side information. The coding parameter is placed in the coding code stream through a sign, an identifier or data, and is transmitted to a decoding end. Different solutions include different coding parameters, for example, if a set of fixed prediction coefficients is used for prediction in a compression coding method, no prediction parameter needs to be coded and transmitted; if more than one set of fixed prediction coefficients are used for switching in the compression coding method, a parameter embodying prediction information in the coding parameters includes a fixed prediction quantization parameter, that is, identification information that may embody a serial number of the fixed prediction coefficient; and if short-term LPC prediction is adopted in the compression coding method, the parameter embodying the prediction information in the coding parameters includes the prediction coefficient.

Step 702: Perform entropy decoding on the residual signal according to the decoded coding parameter to obtain an absolute value signal through synthesis.

Entropy decoding is performed on the demultiplexed residual signal, and the residual signal of each sampling point is synthesized to obtain the absolute value signal according to the prediction coefficient in the coding parameter.

For example, in the short-term LPC prediction, an absolute value signal z(n) is obtained by a reverse process of obtaining a residual signal $$e(n) = z(n) - \sum_{i=1}^{p} \hat{a}(i)z(n-i)$$

in the compression coding method; therefore, the synthesizing the residual signal to obtain the absolute value signal may be implemented in the following manner:

$$z(n) = e(n) + \sum_{i=1}^{p} \hat{a}(i)z(n-i).$$

In the fixed prediction coefficient prediction, the absolute value signal z(n) is obtained by a reverse process of obtaining the residual signal $$e(n) = -z(n) + \sum_{i=1}^{2^m} \frac{1}{2^m} z(n-i)$$

in the compression coding method; therefore, the synthesizing the residual signal to obtain the absolute value signal may be implemented in the following manner:

$$z(n) = \sum_{i=1}^{2^m} \frac{1}{2^m} z(n-i) - e(n),$$

and if m=2 in the preceding formula, $$\begin{cases} z(n) = e(n) & n < 4 \\ z(n) = 0.25 * (z(n-1) + z(n-2) + \\ \quad z(n-3) + z(n-4)) - e(n) & 4 \le n < N, \end{cases}$$

where 0.25 is the prediction coefficient.

Step 703: Inverse-quantize the sign information to obtain a sign signal according to the decoded coding parameter.

An inverse-quantization process reverse to that in the compression coding method is performed on the sign information according to the quantization parameter in the coding parameter to obtain an inverse-quantized sign signal.

Step 704: Synthesize the absolute value signal and the sign signal to obtain an output signal.

Step 705: Inverse-map the output signal by using the mapping coefficient in the decoded coding parameter.

When the coding parameter includes the mapping coefficient, according to the mapping coefficient in the coding parameter, inverse mapping reverse to that in the compression coding method is adopted to restore an original voice and audio signal, and the compression decoding method ends.

When some other special mapping methods are adopted in coding, the mapping coefficient may not need to be transmitted, and the inverse mapping reverse to that in the compression coding method is directly used to restore an original voice and audio signal. The compression decoding method ends.

Furthermore, the coding parameter in this embodiment may further include side information, used for identifying information in different implementation means applied to the input signal in each compression coding embodiment. Other compression decoding method embodiments may be implemented correspondingly to each compression coding method embodiment, and the difference lies in that, each compression decoding embodiment is a reverse process of the corresponding compression coding embodiment. For persons skilled in the art, these are all implementable embodiments and are solutions that may be obtained through the compression coding method.

By introducing this embodiment, input signals with different characteristics can be effectively compressed, an obvious compression gain is obtained, and compression efficiency of a voice and audio signal is improved.

Compression Coder Embodiment 1

Figure 10:
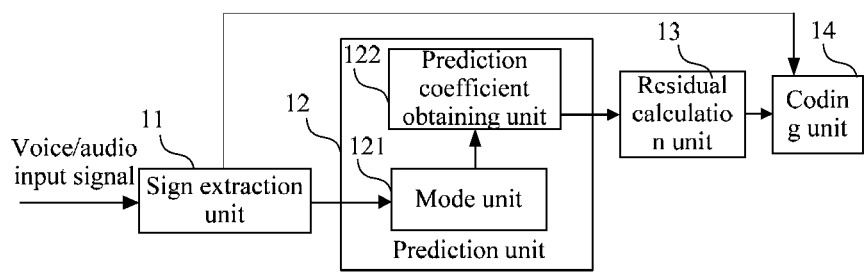
FIG. 10 is a schematic diagram of a compression coder according to a first embodiment.

FIG. 10 is a schematic diagram of a compression coder according to a first embodiment.

The compression coder in this embodiment includes a sign extraction unit 11, a prediction unit 12, a residual calculation unit 13, and a coding unit 14. The sign extraction unit 11 is configured to extract sign information of an input signal. The prediction unit 12 is configured to obtain a prediction coefficient by prediction and analysis that are performed according to a signal characteristic of an absolute value signal that is obtained after the sign information of the input signal is extracted. The residual calculation unit 13 is configured to obtain, according to the prediction coefficient, a residual signal of the absolute value signal for entropy coding. The coding unit 14 is configured to respectively code the residual signal, the sign information and a coding parameter.

In this embodiment, the sign extraction unit 11 of the compression coder extracts the sign information of the input signal, and processes the input signal, to respectively obtain the sign information and the absolute value signal of the input signal. The sign extraction unit 11 sends the absolute value signal that is obtained after the sign information is extracted to the prediction unit 12. The prediction unit 12 analyzes the signal characteristic of the absolute value signal, determines a prediction coding mode, performs prediction and analysis according to the determined prediction coding mode to obtain the prediction coefficient, and sends the prediction coefficient to the residual calculation unit 13. The residual calculation unit 13 uses a predictor corresponding to the prediction coefficient to perform prediction on the absolute value signal according to a sampling point to obtain a residual signal of each sampling point of the absolute value signal. The coding unit 14 is configured to code the residual signal, the sign information and the coding parameter. The compression coder outputs the coded sign information and residual signal.

Furthermore, the prediction unit includes a mode unit 121, configured to determine a prediction mode according to the signal characteristic of the absolute value signal of the input signal, where the signal characteristic includes a frequency spectrum energy characteristic and a noise characteristic of the absolute value signal, complexity of performing the prediction, or the number of bits required for transmitting the prediction coefficient; and a prediction coefficient obtaining unit 122, configured to perform prediction and analysis on the determined prediction mode to obtain the prediction coefficient. The coding unit includes performing entropy coding on the residual signal, quantizing the sign information, and coding the coding parameter.

This embodiment may also be implemented correspondingly to the compression coding method embodiment 2.

By introducing this embodiment, input signals with different characteristics can be effectively compressed, an obvious compression gain is obtained, and compression efficiency of a voice and audio signal is improved.

Compression Coder Embodiment 2

Figure 11:
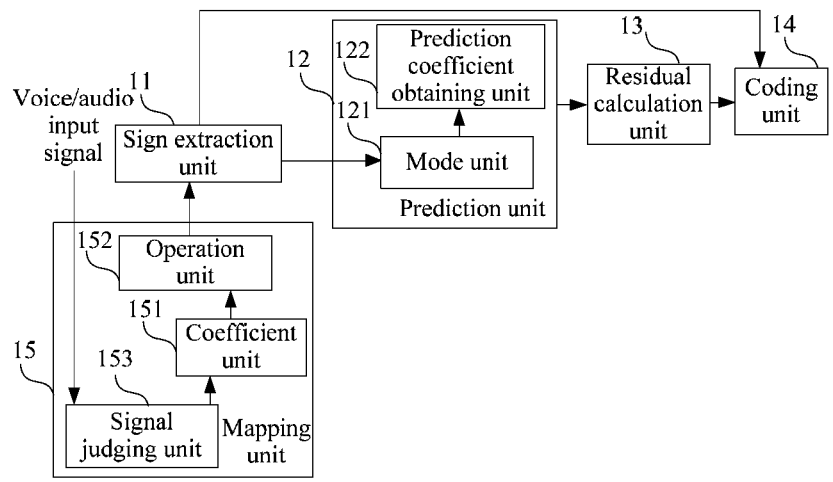
FIG. 11 is a schematic diagram of a compression coder according to a second embodiment.

FIG. 11 is a schematic diagram of a compression coder according to a second embodiment.

Based on the compression coder embodiment 1, this embodiment further includes a mapping unit 15, configured to map the input signal to obtain a zero-mean signal. In the compression coder embodiment, the input signal is a zero-mean signal. For the input signal, when it is impossible to know whether the input signal is a zero-mean signal, the compression coder further includes a mapping unit 15. The mapping unit 15 includes a coefficient unit 151, configured to select a mean value of the input signal as a mapping coefficient according to distribution of sampling points of the input signal; and an operation unit 152, configured to perform a mapping operation on the input signal and the mapping coefficient to obtain a zero-mean signal, and send the zero-mean signal to the sign extraction unit 11. Furthermore, the mapping unit 15 may further include a signal judging unit 153, configured to judge whether the input signal is a zero-mean signal, and when the input signal is a zero-mean signal, send a signal judgment result to the coefficient unit 151. This embodiment may also be implemented correspondingly to the compression coding method embodiment 3.

In another compression coder embodiment 3, the compression coder further includes a first pre-processing unit 16. The first pre-processing unit 16 is configured to recognize that a frame characteristic of the input signal satisfies a preset condition, and send a recognition result to the sign extraction unit 11 or the mapping unit 15. This embodiment may also be implemented corresponding to the compression coding method embodiment 4.

Figure 12:
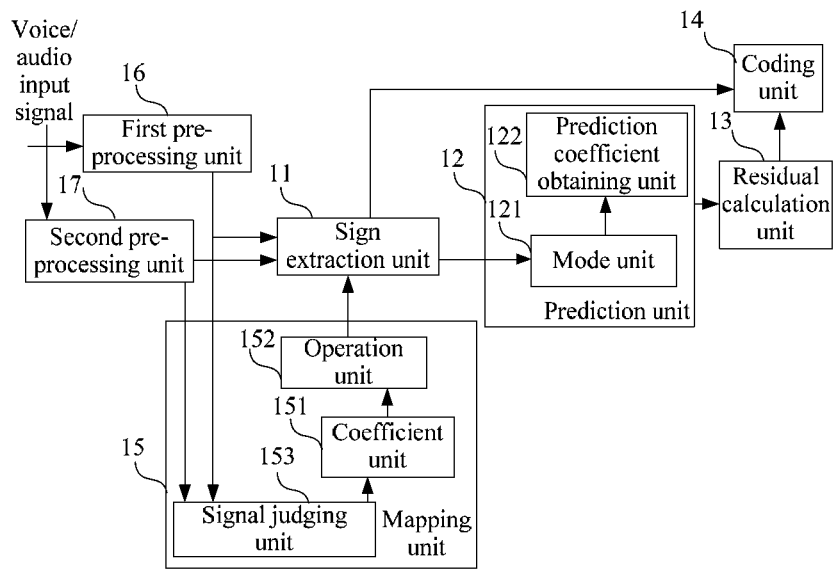
FIG. 12 is a schematic diagram of another compression coder according to an embodiment.

In another compression coder embodiment 4, the compression coder further includes a second pre-processing unit 17. The second pre-processing unit 17 is configured to recognize that a compression gain obtained by coding the input signal using at least one of other ordinary coding modes is smaller than or equal to a preset threshold, and send the recognition result to the sign extraction unit 11 or the mapping unit 15. This embodiment may also be implemented correspondingly to the compression coding method embodiment 5, and the compression coder embodiments 3 and 4 may also be implemented in combination, as shown in FIG. 12.

By introducing this embodiment, input signals with different characteristics can be effectively compressed, an obvious compression gain is obtained, and compression efficiency of a voice and audio signal is improved.

At a coding end, a collected voice and audio signal enters a compression coder, data after being compressed and coded by the compression coder is re-processed to form a coding code stream, and the coding code stream is sent to a decoding end. The decoding end parses the received coding code stream to obtain data to be decoded, and decompression is performed to restore an original signal through compression decoder embodiments described in the following.

Compression Decoder Embodiment 1

Figure 13:
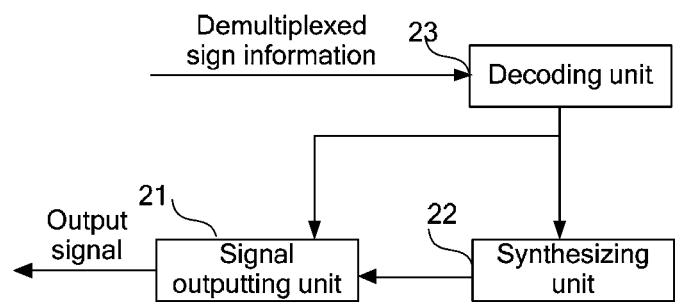
FIG. 13 is a schematic diagram of a compression decoder according to a first embodiment.

FIG. 13 is a schematic diagram of a compression decoder according to a first embodiment.

The compression decoder in this embodiment includes a decoding unit 23, a synthesizing unit 22, and a signal outputting unit 21. The compression decoder decompresses a parsed coding code stream by using a reverse process to that of a compression coder. The decoding unit 23 respectively decodes demultiplexed sign information, a demultiplexed residual signal and a demultiplexed coding parameter to obtain a decoded sign signal, residual signal and coding parameter. The synthesizing unit 22 synthesizes the residual signal to obtain an absolute value signal according to the decoded coding parameter. The signal outputting unit 21 synthesizes the decoded sign signal and the absolute value signal to obtain an output signal.

By introducing this embodiment, input signals with different characteristics can be effectively compressed, an obvious compression gain is obtained, and compression efficiency of a voice and audio signal is improved.

Compression Decoder Embodiment 2

Figure 14:
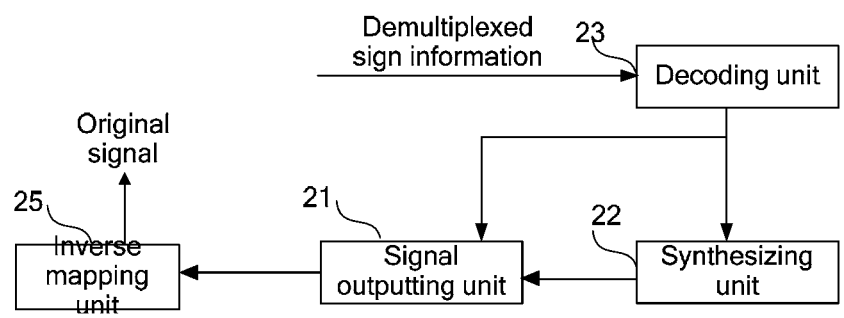
FIG. 14 is a schematic diagram of a compression decoder according to a second embodiment.

FIG. 14 is a schematic diagram of a compression decoder according to a second embodiment.

The compression decoder in this embodiment includes a decoding unit 23, a synthesizing unit 22, and a signal outputting unit 21. The compression decoder decompresses a parsed coding code stream by using a reverse process to that of a compression coder. The decoding unit 23 respectively decodes demultiplexed sign information, a demultiplexed residual signal and a demultiplexed coding parameter to obtain a decoded sign signal, residual signal and coding parameter. The synthesizing unit 22 synthesizes the residual signal to obtain an absolute value signal according to the decoded coding parameter. The signal outputting unit 21 is configured to synthesize the sign signal and the absolute value signal to obtain an output signal. The compression decoder may further include an inverse mapping unit 25.

The decoding unit 23 receives the coding parameter, the sign information and the residual signal that are obtained after the coding code stream is demultiplexed; decodes the coding parameter, extracts a quantization parameter from the decoded coding parameter to inverse-quantize the demultiplexed sign information to obtain an inverse-quantized sign signal; and performs entropy decoding on the demultiplexed residual signal to obtain an entropy-decoded residual signal. The synthesizing unit 22 receives the entropy-decoded residual signal, and synthesizes a residual signal of each sampling point to obtain an absolute value signal according to a prediction coefficient or a fixed prediction quantization parameter in the decoded coding parameter. For example, in short-term LPC prediction, an absolute value signal z(n) is obtained by a reverse process of obtaining a residual signal $$e(n) = z(n) - \sum_{i=1}^{p} \hat{a}(i)z(n-i)$$

in the compression coding method; therefore, the synthesizing the residual signal to obtain the absolute value signal may be implemented in the following manner:

$$z(n) = e(n) + \sum_{i=1}^{p} \hat{a}(i)z(n-i).$$

In fixed prediction coefficient prediction, the absolute value signal z(n) is obtained by a reverse process of obtaining the residual signal $$e(n) = -z(n) + \sum_{i=1}^{2m} \frac{1}{2^m} z(n-i)$$

in the compression coding method; therefore, the synthesizing the residual signal to obtain the absolute value signal may be implemented in the following manner:

$$z(n) = \sum_{i=1}^{2m} \frac{1}{2^m} z(n-i) - e(n),$$

and if m=2 in the preceding formula, $$\begin{cases} z(n) = e(n) & n < 4 \\ z(n) = 0.25*(z(n-1)+z(n-2)+ \\ \quad z(n-3)+z(n-4))-e(n) & 4 \le n < N, \end{cases}$$

where 0.25 is the prediction coefficient.

The signal outputting unit 21 synthesizes the inverse-quantized sign signal output by the decoding unit 23 and the absolute value signal output by the synthesizing unit 22 to obtain the output signal. If the inverse mapping unit 25 extracts the mapping coefficient from the coding parameter of the demultiplexed coding code stream, the inverse mapping unit 25 inverse-maps the output signal of the signal outputting unit 21 to obtain an original signal that is input to a coding end. In a different compression coding embodiment, the coding parameter may include any one or more kinds of the following: a quantization parameter and a prediction coefficient, or a fixed prediction quantization parameter, a mapping coefficient, and side information. The coding parameter is placed in the coding code stream through a sign, an identifier, or data, and is transmitted to a decoding end.

In addition to this embodiment, other compression decoder embodiments may be implemented by other compression coders in a reverse method to that in each compression coding method embodiment.

By introducing this embodiment, input signals with different characteristics can be effectively compressed, an obvious compression gain is obtained, and compression efficiency of a voice and audio signal is improved.

A compression coding device at a coding end compresses and codes a collected voice and audio signal. The collected voice and audio signal is received and sent to a compression coder, and through compression and coding, coded data is output. The coded data and a coding parameter are multiplexed to obtain a coding code stream. The coding code stream generated by the compression coding device is sent to a decoding end for decompression to restore an original signal.

Compression Coding Device Embodiment 1

Figure 15:
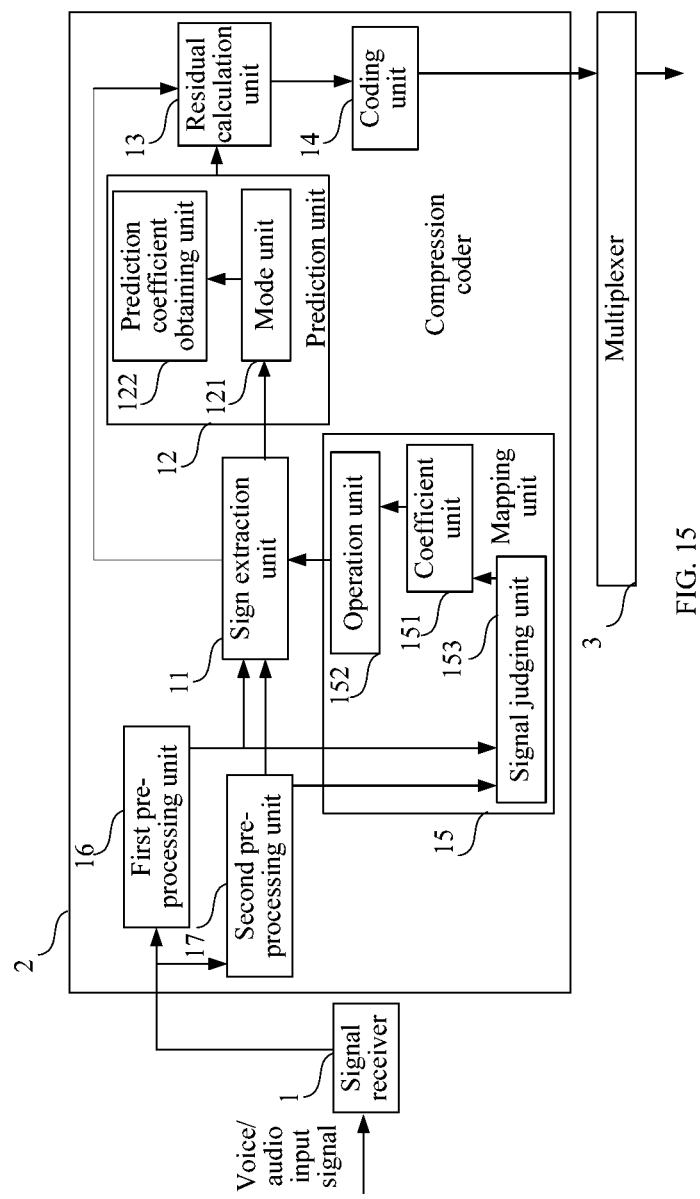
FIG. 15 is a schematic diagram of a compression coding device according to an embodiment.

FIG. 15 is a schematic diagram of a compression coding device according to an embodiment.

In this embodiment, the compression coding device includes a signal receiver 1, a compression coder 2, and a code stream multiplexer 3. The signal receiver 1 is configured to receive an input signal. The compression coder 2 is configured to extract sign information of the input signal to obtain an absolute value signal of the input signal; obtain a residual signal of the absolute value signal by using a prediction coefficient, where the prediction coefficient is obtained by prediction and analysis that are performed according to a signal characteristic of the absolute value signal of the input signal; and code the sign information, the residual signal and a coding parameter. The code stream multiplexer 3 is configured to multiplex coded and quantized sign information, an entropy-coded residual signal, and the coded coding parameter of the compression coder to form a coding code stream, and output the coding code stream to a decoding end.

The compression coder 2 in this embodiment includes a sign extraction unit 11, a prediction unit 12, a residual calculation unit 13, and a coding unit 14. The sign extraction unit 11 is configured to extract sign information of an input signal. The prediction unit 12 is configured to obtain a prediction coefficient by prediction and analysis that are performed according to a signal characteristic of an absolute value signal that is obtained after the sign information of the input signal is extracted. The residual calculation unit 13 is configured to obtain, according to the prediction coefficient, a residual signal of the absolute value signal for entropy coding. The coding unit 14 is configured to respectively code the residual signal, the sign information and a coding parameter.

In this embodiment, the sign extraction unit 11 of the compression coder extracts the sign information of the input signal, and processes the input signal, to respectively obtain the sign information and the absolute value signal of the input signal. The sign extraction unit 11 sends the absolute value signal that is obtained after the sign information is extracted to the prediction unit 12. The prediction unit 12 analyzes the signal characteristic of the absolute value signal, determines a prediction coding mode, performs prediction and analysis according to the determined prediction coding mode to obtain the prediction coefficient, and sends the prediction coefficient to the residual calculation unit 13. The residual calculation unit 13 uses a predictor corresponding to the prediction coefficient to perform prediction on the absolute value signal according to a sampling point to obtain a residual signal of each sampling point of the absolute value signal. The coding unit 14 is configured to code the residual signal, the sign information and the coding parameter. The compression coder 2 outputs the coded sign information and residual signal. The entropy-coded residual information and the quantized sign information are multiplexed.

In this embodiment, the compression coder may be implemented through the compression coder embodiments 1 to 4 by using the compression coding method embodiments 1 to 5.

By introducing this embodiment, input signals with different characteristics can be effectively compressed, and especially for a signal that fails to be effectively compressed in a conventional prediction method, an obvious compression gain may be obtained, so that compression efficiency of a voice and audio signal is improved.

The preceding embodiments may be applied to lossless coding of a voice and audio signal, and may also be applied to lossy coding or other data compression application.

Persons of ordinary skill in the art may understand that all or a part of the processes of the method in the preceding embodiments may be implemented by a program instructing relevant hardware. The program may be stored in a computer readable storage medium. When the program runs, the processes of the method in the preceding embodiments are performed. The storage medium may be a magnetic disk, an optical disk, a Read-Only Memory (ROM), or a Random Access Memory (RAM).

Finally, it should be noted that the preceding embodiments are merely used for describing the technical solutions of the present invention, but are not intended to limit the present invention. It should be understood by persons of ordinary skill in the art that although the embodiments of the present invention have been described in detail with reference to exemplary embodiments, modifications or equivalent replacements may still be made to the technical solutions in the embodiments of the present invention, however, these modifications or equivalent replacements cannot make the modified technical solutions depart from the spirit and scope of the technical solutions in the embodiments of the present invention.

What is claimed is:

1. A method for performing compression coding on a voice and audio input signal and implemented by a processor, comprising:

extracting sign information of the voice and audio input signal to obtain an absolute value signal of the input signal;

obtaining a residual signal of the absolute value signal by using a prediction coefficient, wherein the prediction coefficient is obtained by prediction and analysis that are performed according to a signal characteristic of the absolute value signal of the input signal; and multiplexing the residual signal, the sign information and a coding parameter to output a coding code stream, after the residual signal, the sign information and the coding parameter are respectively coded.

2. The method according to claim 1, wherein before the extracting the sign information of the input signal to obtain the absolute value signal of the input signal, comprising: recognizing that a frame characteristic of the input signal satisfies a preset condition and/or recognizing that a compression gain obtained by coding the input signal using at least one of other ordinary coding modes is smaller than or equal to a preset threshold.

3. The method according to claims 1, wherein the input signal is a zero-mean signal, and before the extracting the sign information of the input signal to obtain the absolute value signal of the input signal, further comprising: mapping the input signal to obtain a zero-mean signal.

4. The method according to claim 3, wherein the mapping the input signal to obtain the zero-mean signal comprises:

selecting a mean value of the input signal as a mapping coefficient according to distribution of sampling points of the input signal; and performing a mapping operation on the input signal and the mapping coefficient to obtain the zero-mean signal.

5. The method according to claim 1, wherein the obtaining the prediction coefficient by prediction and analysis that are performed according to the signal characteristic of the absolute value signal of the input signal comprises:
   determining a prediction mode according to the signal characteristic of the absolute value signal of the input signal and according to an environmental parameter, wherein the signal characteristic and the environmental parameter comprise a frequency spectrum energy characteristic and a noise characteristic of the absolute value signal, complexity of performing the prediction, or the number of bits required for transmitting the prediction coefficient; and
   performing prediction and analysis on the determined prediction mode to obtain the prediction coefficient.

6. The method according to claim 4, wherein before the multiplexing the residual signal, the sign information and the coding parameter are respectively coded, comprising:
   performing entropy coding on the residual signal;
   quantizing the sign information; and
   coding the coding parameter, wherein
   the coding parameter comprises the mapping coefficient, the prediction coefficient, a quantization coefficient, or side information.

7. The method according to claim 5, wherein the prediction mode comprises short-term linear prediction coding (LPC) prediction or fixed coefficient prediction, and a predictor adopting the fixed coefficient prediction is designed as follows:

$$-1 + z^{-1};$$
$$-1 + 0.5(z^{-1} + z^{-2});$$
$$-1 + 0.25(z^{-1} + z^{-2} + z^{-3} + z^{-4});$$
$$\ldots$$
$$-1 + \sum_{i=1}^{2^m} \frac{1}{2^m} z^{-i},$$

wherein $m = 0, 1, \ldots, L$, $L < (N-1)$, and N is the length of the input signal;
or expressed by a prediction value:

$$z'(n) = z(n - 1);$$
$$z'(n) = 0.5 * (z(n - 1) + z(n - 2));$$
$$z'(n) = 0.25 * (z(n - 1) + z(n - 2) + z(n - 3) + z(n - 4));$$
$$\ldots$$
$$z'(n) = \sum_{i=1}^{2^m} \frac{1}{2^m} z(n - i),$$

wherein $z'(n)$ is the prediction value of the signal, and the prediction coefficient is $\frac{1}{2^m}$;
or
$z'(n) = 0.25 * (z(n-1) + z(n-2) + z(n-3) + z(n-4))$, wherein $z'(n)$ is the prediction value of the signal, and the prediction coefficient is 0.25.

8. The method according to claim 1, wherein the obtaining the residual signal of the absolute value signal by using the prediction coefficient comprises:

$$\begin{cases} e(n) = z(n) & n < 4 \\ e(n) = 0.25 * (z(n-1) + z(n-2) + \\ \quad z(n-3) + z(n-4)) - z(n) & 4 \leq n < N, \end{cases}$$

wherein $z(n)$ is the absolute value signal, and $e(n)$ is the residual signal.

9. A compression decoding method based on the method for performing compression coding on a voice and audio input signal according to claim 1 and implemented by a processor, comprising:
   demultiplexing a coding code stream to obtain sign information, a residual signal and a coding parameter;
   synthesizing the residual signal that is entropy-decoded to obtain an absolute value signal;
   inverse-quantizing the sign information according to the coding parameter that is decoded to obtain a sign signal; and
   synthesizing the absolute value signal and the sign signal to obtain an output signal.

10. The method according to claim 9, wherein the coding parameter comprises a mapping coefficient, a prediction coefficient, a quantization parameter, or side information.

11. The method according to claim 9, wherein after the synthesizing the absolute value signal and the sign signal to obtain the output signal, the mapping coefficient is used to inverse-map the absolute value signal of the output signal.

12. A compression coder, wherein the compression coder comprises:
   a hardware processor;
   a sign extraction unit, configured to extract, using the hardware processor, sign information of a voice and audio input signal;
   a prediction unit, configured, using the hardware processor, to obtain a prediction coefficient by prediction and analysis that are performed according to a signal characteristic of an absolute value signal that is obtained after the sign information of the input signal is extracted;
   a residual calculation unit, configured, using the hardware processor, to obtain, according to the prediction coefficient, a residual signal of the absolute value signal for entropy coding; and
   a coding unit, configured, using the hardware processor, to respectively code the residual signal, the sign information and a coding parameter.

13. The compression coder according to claim 12, wherein, the compression code further comprises a first pre-processing unit and/or a second pre-processing unit; the first pre-processing unit is configured to recognize that a frame characteristic of the input signal satisfies a preset condition, and send a recognition result to the sign extraction unit; and the second pre-processing unit is configured to recognize that a compression gain obtained by coding the input signal using at least one of other ordinary coding modes is smaller than or equal to a preset threshold, and send the recognition result to the sign extraction unit.

14. The compression coder according to claim 12, wherein, the compression coder further comprises a mapping unit, configured to map the input signal to obtain a zero-mean signal.

15. The compression coder according to claim 14, wherein the mapping unit comprises:
   a coefficient unit, configured to select a mean value of the input signal as a mapping coefficient according to distribution of sampling points of the input signal; and
   an operation unit, configured to perform a mapping operation on the input signal and the mapping coefficient to obtain the zero-mean signal, and send the zero-mean signal to the sign extraction unit and/or the prediction unit.

16. The compression coder according to claim 12, wherein the prediction unit comprises:
   a mode unit, configured to determine a prediction mode according to the signal characteristic of the absolute value signal of the input signal; and
   a prediction coefficient obtaining unit, configured to perform prediction and analysis on the determined prediction mode to obtain the prediction coefficient.

17. The compression coder according to claim 16, wherein if a fixed coefficient prediction mode is adopted, a predictor is designed as follows:

$$-1 + z^{-1};$$
$$-1 + 0.5(z^{-1} + z^{-2});$$
$$-1 + 0.25(z^{-1} + z^{-2} + z^{-3} + z^{-4});$$
$$\ldots$$
$$-1 + \sum_{i=1}^{2^m} \frac{1}{2^m} z^{-i},$$

wherein m=0, 1, L, ..., L<(N−1), and N is the length of the input signal;
or expressed by a prediction value:

$$z'(n) = z(n-1);$$
$$z'(n) = 0.5 * (z(n-1) + z(n-2));$$
$$z'(n) = 0.25 * (z(n-1) + z(n-2) + z(n-3) + z(n-4));$$
$$\ldots$$
$$z'(n) = \sum_{i=1}^{2^m} \frac{1}{2^m} z(n-i),$$

wherein z'(n) is the prediction value of the signal, and the prediction coefficient is $1/2^m$;
or
z'(n)=0.25*(z(n−1)+z(n−2)+z(n−3)+z(n−4)), wherein z'(n) is the prediction value of the signal, and the prediction coefficient is 0.25.

18. The compression coder according to claim 12, wherein the residual calculation unit obtains, according to the prediction coefficient, the residual signal of the absolute value signal for entropy coding:

$$\begin{cases} e(n) = z(n) & n < 4 \\ e(n) = 0.25 * (z(n-1) + z(n-2) + \\ \qquad z(n-3) + z(n-4)) - z(n) & 4 \le n < N, \end{cases}$$

wherein z(n) is the absolute value signal, and e(n) is the residual signal.

19. The compression coder according to claim 15, wherein the coding unit comprises:
   an entropy coding unit, configured to perform entropy coding on the residual signal;
   a quantizing unit, configured to perform quantization and coding on the sign information; and
   a parameter coding unit, configured to code the coding parameter.

20. A compression decoder based on the compression coder according to claim 12, wherein, the compression decoder comprises:
   a decoding unit, configured to decode demultiplexed sign information, a demultiplexed residual signal, and a demultiplexed coding parameter;
   a synthesizing unit, configured to synthesize the residual signal according to the decoded coding parameter to obtain an absolute value signal; and
   a signal outputting unit, configured to synthesize the decoded sign signal and the decoded absolute value signal to obtain an output signal.

21. The compression decoder according to claim 20, wherein, the compression decoder further comprises an inverse mapping unit, configured to inverse-map an input signal to obtain the output signal.

22. A compression coding device, comprising the compression coder according to claims 12, and further comprising a signal receiver, configured to receive a voice and audio input signal; and a code stream multiplexer, configured to multiplex sign information, and a residual signal of the input signal, and a coding parameter of the compression coder to form a coding code stream, after the sign information, and the residual signal of the input signal, and the coding parameter of the compression coder are respectively coded.

* * * * *

UNITED STATES PATENT AND TRADEMARK OFFICE
CERTIFICATE OF CORRECTION

PATENT NO.         : 8,489,405 B2                                    Page 1 of 1
APPLICATION NO.    : 13/309373
DATED              : July 16, 2013
INVENTOR(S)        : Qi et al.

It is certified that error appears in the above-identified patent and that said Letters Patent is hereby corrected as shown below:

In the Claims

Claim 12, Column 20, line 41 "a prediction unit, configured using the hardware"
should read -- a prediction unit, configured to obtain, using the hardware --.

Claim 12, Column 20, line 46 "a residual calculation unit, configured using the"
should read -- a residual calculation unit, configured to obtain, using the --.

Claim 12, Column 20, lines 50-51 "configured using the hardware processor, to respectively code"
should read -- configured to respectively code, using the hardware processor --.

Signed and Sealed this
Fifteenth Day of October, 2013

Teresa Stanek Rea
*Deputy Director of the United States Patent and Trademark Office*